(12) United States Patent
Kuang

(10) Patent No.: US 9,340,864 B2
(45) Date of Patent: May 17, 2016

(54) VACUUM EVAPORATION APPARATUS AND EVAPORATION METHOD

(71) Applicant: Shenzhen China Star Optoelectronics Technology Co., Ltd., Shenzhen, Guangdong (CN)

(72) Inventor: Youyuan Kuang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 284 days.

(21) Appl. No.: 14/238,267

(22) PCT Filed: Jan. 10, 2014

(86) PCT No.: PCT/CN2014/070457
§ 371 (c)(1),
(2) Date: Feb. 11, 2014

(87) PCT Pub. No.: WO2015/100787
PCT Pub. Date: Jul. 9, 2015

(65) Prior Publication Data
US 2016/0010202 A1 Jan. 14, 2016

(30) Foreign Application Priority Data
Dec. 30, 2013 (CN) .......................... 2013 1 0740171

(51) Int. Cl.
*C23C 14/24* (2006.01)
*C23C 14/04* (2006.01)

(52) U.S. Cl.
CPC ............... *C23C 14/24* (2013.01); *C23C 14/042* (2013.01)

(58) Field of Classification Search
None
See application file for complete search history.

(56) References Cited

U.S. PATENT DOCUMENTS

2009/0095213 A1* 4/2009 Birkmire ................. F27B 14/00
118/50
2011/0311717 A1* 12/2011 Yamazaki ............... C23C 14/12
427/66

FOREIGN PATENT DOCUMENTS

CN 101949002 A 1/2011
JP H0949072 A 2/1997

* cited by examiner

*Primary Examiner* — Nathan T Leong
(74) *Attorney, Agent, or Firm* — Andrew C. Cheng

(57) ABSTRACT

The present invention provides a vacuum evaporation apparatus. The apparatus comprises a vacuum chamber; an evaporation source disposed in the interior of the vacuum chamber, and having an inner heat unit and an outer heat unit located outside; a material container formed at an inner wall of the inner heat unit; a vacuum intermediate layer formed between an outer wall of the inner heat unit and the inner wall of the outer heat unit; a first branch at the inner heat unit for allowing a vapor to pass through; and a second branch at the outer heat unit for allowing the vapor to pass through. The device can overcome the influence of the color purity of light by gap forming by the deformation at the middle of the mask by the gravity, and increase the heating uniformity of the evaporation material and the stability of the evaporation rate.

8 Claims, 4 Drawing Sheets

VACUUM EVAPORATION APPARATUS AND EVAPORATION METHOD

BACKGROUND OF THE INVENTION

1. Field of the Invention

The present invention relates to display technology field, and more particularly to a vacuum evaporation apparatus and an evaporation method.

2. Description of Related Art

The organic light emitting display panel is a self-luminous display panel, which having advantages of solid-state, thin, non-limitation of viewing angle, rapid response, room temperature operation, easy to realize a flexible display and 3D display, etc., and it is recognized as the mainstream technology of the next generation display.

In the manufacturing process of the organic light emitting panel, it requires to form an organic light emitting layer on the substrate, that is, forming an organic light emitting diode (OLED) on the substrate. Currently, the forming of the organic light emitting diode is mainly used the method of heating evaporation coating. With reference to FIG. 1, it is the vacuum evaporation apparatus in the prior art, and comprising a vacuum chamber, an evaporation source 50 disposed inside the vacuum chamber, and a cooling plate 210 located above the evaporation source 50.

Wherein, the evaporation source 50 includes a material container 510 and a heating source 520 disposed at the outside of the material container 510. In the manufacturing of the organic light emitting panel, sequentially disposing the substrate 220 and the mask 230 below the cooling plate 210, a side of the substrate 220 waiting to deposit the evaporation material face toward the evaporation source 50, wherein, the cooling plate 210 is used for fixing the substrate 220 and the mask 230, and also used for cooling the substrate 220.

The heating source 520 heats the material container 510, the evaporation material 530 inside the material container 510 is heated to become a material vapor and it flows into the vacuum chamber. The material vapor flow through the opening area of the mask 230, and it is cooled on the substrate 220 to form the organic light emitting layer. However, in the evaporation process, the mask 230 will deform by the influence of the gravity, resulting in a gap between the mask 230 and the substrate 220. The material vapor will deposit on an area other than the opening area of the substrate 23, and then, it will impact the color purity of light of the OLED display panel, which decreasing the display effect of the OLED display panel. Especially for a large-size display panel, the larger the size of the display panel, the deformation of mask 230 influenced by the gravity is more obvious such that the display effect is worse.

SUMMARY OF THE INVENTION

To solve the above problems of the prior art, an object of the present invention is to provide a vacuum evaporation apparatus. The device can overcome the influence of the color purity of light by gap forming by the deformation at the middle of the mask by the gravity, and increase the heating uniformity of the evaporation material and the stability of the evaporation rate.

To achieve the above object, the present invention provides a vacuum evaporation apparatus, comprising a vacuum chamber; an evaporation source disposed in the interior of the vacuum chamber, wherein the evaporation source comprises an inner heat unit and an outer heat unit located outside the inner heat unit; a material container formed at an inner wall of the inner heat unit; a vacuum intermediate layer formed between an outer wall of the inner heat unit and the inner wall of the outer heat unit; a first branch provided at the inner heat unit for allowing a vapor to pass through; and a second branch provided at the outer heat unit for allowing the vapor to pass through.

Wherein, an opening of the second branch is smaller than a surface area of the first branch.

Wherein, the vacuum evaporation apparatus further comprises a cooling plate disposed below the evaporation source, and a second branch is provided at a bottom side of the outer heat unit.

Wherein, the vacuum evaporation apparatus further comprises a high temperature fluid output unit for providing a high temperature fluid for the inner heat unit and the outer heat unit; the inner heat unit and the outer heat unit utilize the circular high temperature fluid to perform heating.

Wherein, the vacuum evaporation apparatus comprises one evaporation source and one high temperature fluid output unit connected with the evaporation source.

Wherein, the vacuum evaporation apparatus comprises a plurality of evaporation sources arranged in parallel and one high temperature fluid output unit connected with the plurality of evaporation sources.

Wherein, the vacuum evaporation apparatus comprises a plurality of evaporation sources arranged in parallel, and a plurality of high temperature fluid output units respectively connected with the plurality of evaporation sources.

Wherein, a thermal insulation layer is provided between two adjacent evaporation sources.

Wherein, the vacuum evaporation apparatus comprises a power mechanism disposed above the evaporation source or below the cooling plate for driving the evaporation source or the cooling plate to move.

The second object of the present invention is to provide a vacuum evaporation method using the vacuum evaporation apparatus described above to perform evaporation, and comprising: providing a substrate and a mask, and disposing the substrate above a cooling plate and the mask above the substrate; inputting a high temperature fluid to the inner heat unit and the outer heat unit from a high temperature fluid output unit to provide a thermal energy for the material container and the vacuum intermediate layer; and providing an evaporation material from the evaporation source, and depositing on the substrate through an opening of the mask to form an organic light emitting layer.

Wherein, the vacuum evaporation apparatus further comprises a high temperature fluid output unit for providing a high temperature fluid for the inner heat unit and the outer heat unit; the inner heat unit and the outer heat unit utilize the circular high temperature fluid to perform heating.

Wherein, the vacuum evaporation apparatus comprises one evaporation source and one high temperature fluid output unit connected with the evaporation source.

Wherein, the vacuum evaporation apparatus comprises a plurality of evaporation sources arranged in parallel and one high temperature fluid output unit connected with the plurality of evaporation sources.

Wherein, the vacuum evaporation apparatus comprises a plurality of evaporation sources arranged in parallel, and a plurality of high temperature fluid output units respectively connected with the plurality of evaporation sources.

Wherein, a thermal insulation layer is provided between two adjacent evaporation sources.

Wherein, the vacuum evaporation apparatus comprises a power mechanism disposed above the evaporation source or below the cooling plate for driving the evaporation source or the cooling plate to move.

The vacuum evaporation apparatus provided by the present invention uses the way of the vacuum intermediate layer disposed inside the evaporation source and the second branch disposed at the bottom side of the vacuum intermediate layer to spray out the material vapor which is evaporated from the evaporation material from the evaporation source and to deposit the material vapor on the substrate disposed below the evaporation source. Because the mask is disposed above the substrate, the bonding between the mask and the substrate is closer so as to eliminates the problem of mutual interference of the evaporation material of adjacent pixels because of the gap forming by the deformation at the middle of the mask by the gravity in order to increase the display effect of the display panel. At the same time, through the circular high temperature fluid, it performs heating for the material container and the vacuum intermediate layer in order to increase the heating uniformity of the evaporation material and the stability of the evaporation rate. At the same time, the vacuum evaporation apparatus provided by the present invention can not only increase the evaporation rate of the evaporation material, but also can be applied to a mixed evaporation mode for different doping materials.

DETAILED DESCRIPTION OF THE PREFERRED EMBODIMENT

Figure 1:
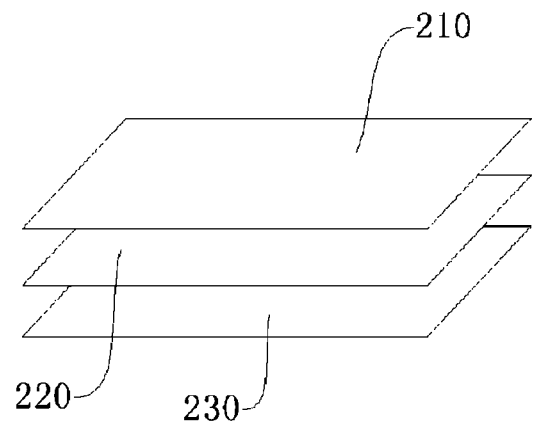
FIG. 1 is a schematic diagram of vacuum evaporation apparatus in the prior art.
Figure 1:
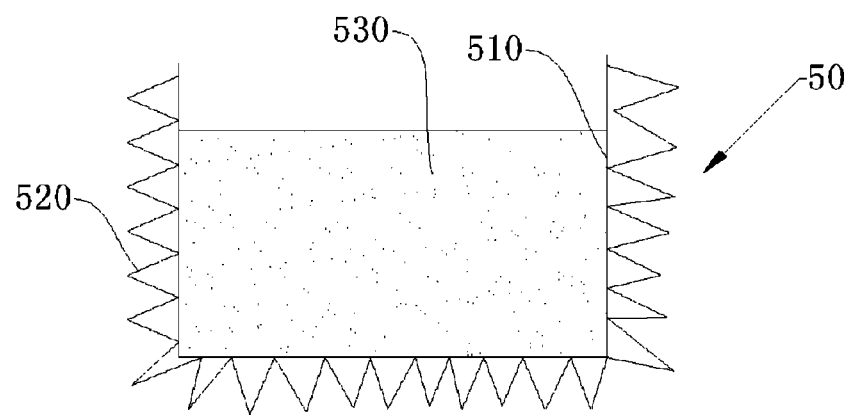

Embodiments of the invention will now be described in detail, and they are exemplarily shown in the drawings, wherein, the same reference numerals refer to the same parts. The following content combines with the drawings and the embodiment for describing the present invention in detail.

First Embodiment

Figure 2:
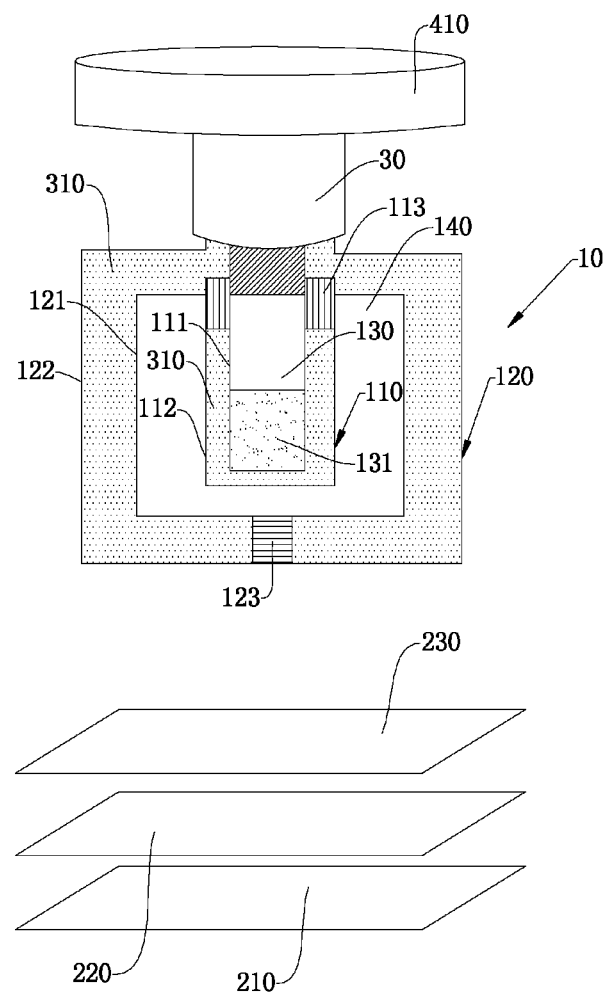
FIG. 2 is a schematic diagram of vacuum evaporation apparatus according to a first embodiment of the present invention.

With reference to FIG. 2, a vacuum evaporation apparatus according to the present embodiment comprises a vacuum chamber, an evaporation source 10 disposed in the interior of the vacuum chamber, and a cooling plate 210 disposed below the evaporation source 10. The cooling plate 210 is used for supporting, fixing and cooling a substrate 220 and a mask 230 sequentially disposed above. The evaporation source 10 comprises an inner heat unit 110 and an outer heat unit 120 located outside the inner heat unit 110. An inner wall 111 of the inner heat unit 110 forms a material container 130. The evaporation material 131 is installed inside the material container 130. A vacuum intermediate layer 140 is formed between the outer wall 112 of the inner heat unit 110 and an inner wall 121 of the outer heat unit 120. A side of the inner heat unit 110 provides with a first branch 113 which allowing the material vapor to pass through. A bottom side of the outer heat unit 120 provides with a second branch 123 which allowing the material vapor to pass through.

Wherein, the inner heat unit 110 is used for heating the evaporation material 131, so that the evaporation material 131 become material vapor to flow into the vacuum intermediate layer 140 from the first branch 113. The inner heat unit 110 and the outer heat unit 120 are used to heat the material vapor inside the vacuum intermediate layer 140 such that the material vapor remains in the vapor state.

In the present embodiment, the vacuum evaporation apparatus also includes a high temperature fluid output unit 30 which is located above the evaporation source 10, used for providing a high temperature fluid 310 for the inner heat unit 110 and the outer heat unit 120. The inner heat unit 110 and the outer heat unit 120 utilize the high temperature fluid 310 circularly flowing inside to perform heating so as to increase the heating uniformity of the evaporation material 131 and the stability of the evaporation rate. Of course, in another embodiment, it can also perform heating by disposing heat devices at the inner heat unit 110 and the outer heat unit 120 or other methods.

The function of the first branch 113 disposed at the side of the inner heat unit 110: allowing material vapor to pass through the inner wall 111 of the inner heat unit 110 and the outer wall 112 of the inner heat unit 110 to flow into the vacuum intermediate layer 140. At the same time, it also makes the high temperature fluid 310 circularly flow between the inner wall 111 of the inner heat unit 110 and the outer wall 112 of the inner heat unit 110.

The function of the second branch 123 disposed at the bottom side of the outer heat unit 120 is similar to the first branch 113: allowing the material vapor to pass through the inner wall 121 of the outer heat unit 120 and the outer wall 122 of the outer heat unit 120 to spray out the vacuum intermediate layer 140. At the same time, it also makes the high temperature fluid 310 circularly flow between the inner wall 121 of the outer heat unit 120 and the outer wall 122 of the outer heat unit 120.

In the present embodiment, an opening of the second branch 123 is smaller than the surface area of the first branch 113, so that after the evaporation material is heated to become the material vapor and the material vapor enters into the vacuum intermediate layer 140, the material vapor is easy to reach the saturated vapor pressure such that the material vapor is easier to spray out from the vacuum intermediate layer 140 through the second branch 123, and at the same time, it can improve the stability of spraying out the material vapor in order to increase the quality of the organic emitting layer deposited through the opening of the mask on the substrate.

Furthermore, the vacuum evaporation apparatus further includes a power mechanism disposed above the high temperature fluid output unit 30. In this embodiment, the power mechanism is a rotational power mechanism 410. The rotational power mechanism 410 is used to drive the evaporation source 10 to rotate such that the after the material vapor spray out from the vacuum intermediate layer 140, the material vapor can be uniformly distributed above the mask 230 inside the vacuum chamber. Of course, in another embodiment, the power mechanism can also be disposed below the cooling plate 210 to drive the cooling plate 210 and the substrate 220 and the mask 230 which are disposed above the cooling plate 210 to move in order to uniformly deposit the material vapor on the substrate.

Based on the same invention concept, the present embodiment also provides a vacuum evaporation method using the vacuum evaporation apparatus described above for perform the evaporation. The vacuum evaporation method comprises: providing a substrate 220 and a mask 230, and disposing the substrate 220 above a cooling plate 210 and the mask 230 above the substrate 220; inputting a high temperature fluid 310 to an inner heat unit 110 and an outer heat unit 120 from a high temperature fluid output unit 30 to provide a thermal energy for a material container 130 and a vacuum intermediate layer 140; heating an evaporation material 131 inside the material container 130 to become a material vapor and to enter into the vacuum intermediate layer 140 from a first branch 113, and keeping the material vapor in a vapor state under a joint action of the inner heat unit 110 and the outer heat unit 120 until a pressure inside the vacuum intermediate layer 140 reaching a saturated vapor pressure; spraying the material vapor into the vacuum chamber from the vacuum intermediate layer 140 through a second branch 123, and uniformly distributing the material vapor above the mask 230 under the function of a rotational power mechanism 410; depositing the material vapor which is cooled and pass through an opening of the mask 230 on the substrate 220 in order to form an organic light emitting layer.

The vacuum evaporation apparatus provided by the present embodiment eliminates the problem of mutual interference of the evaporation material of adjacent pixels because of the gap forming by the deformation at the middle of the mask by the gravity in order to increase the display effect of the display panel. At the same time, through the circular high temperature fluid, it performs heating for the material container and the vacuum intermediate layer in order to increase the heating uniformity of the evaporation material and the stability of the evaporation rate.

Second Embodiment

Figure 3:
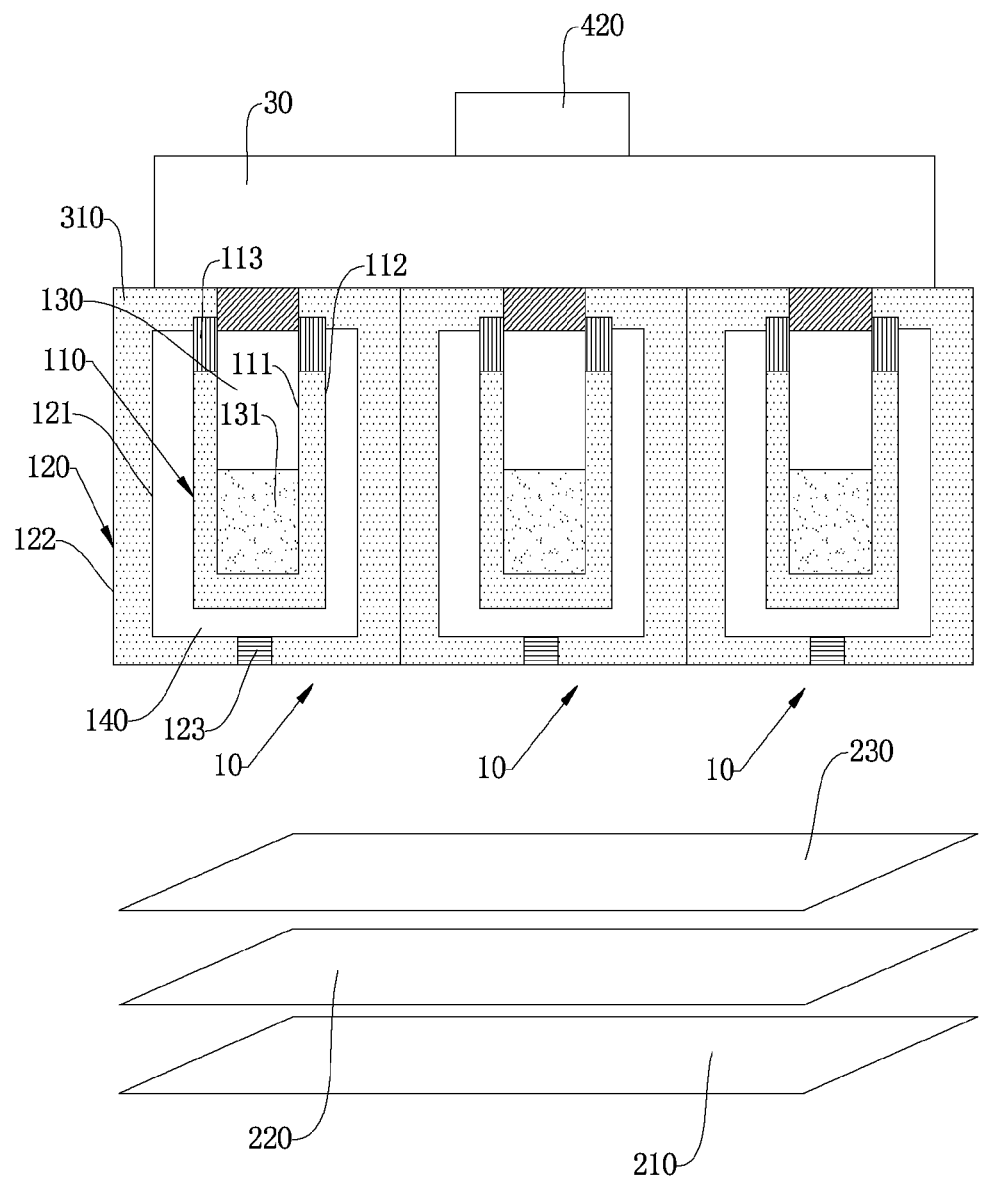
FIG. 3 is a schematic diagram of vacuum evaporation apparatus according to a second embodiment of the present invention.

With reference to FIG. 3, a vacuum evaporation apparatus according to the present embodiment comprises a vacuum chamber, an evaporation source 10 disposed within the interior of the vacuum chamber, and a cooling plate 210 disposed below the evaporation source 10, and a high temperature fluid output unit 30 which is located above the evaporation source 10, used for providing a high temperature fluid 310 for an inner heat unit 110 and an outer heat unit 120. Wherein, the cooling plate 210 is used for supporting, fixing and cooling a substrate 220 and a mask 230 sequentially disposed above the cooling plate 210. The evaporation source 10 comprises the inner heat unit 110 and the outer heat unit 120 located outside the inner heat unit 110. An inner wall 111 of the inner heat unit 110 forms a material container 130. An evaporation material 131 is installed inside the material container 130. A vacuum intermediate layer 140 is formed between an outer wall 112 of the inner heat unit 110 and an inner wall 121 of the outer heat unit 120. A side of the inner heat unit 110 provides with a first branch 113 which allowing the material vapor to pass through. A bottom side of the outer heat unit 120 provides with a second branch 123 which allowing the material vapor to pass through.

The difference between this embodiment and the first embodiment is that the vacuum evaporation apparatus includes a plurality of evaporation sources 10 arranged in parallel and a high temperature fluid output unit 30 connected with the plurality of evaporation sources 10. In this way, it can ensure to increase evaporation rate of the evaporation material 131 under the premise of uniformly heating for the evaporation material 131 in order to increase the growth rate of the OLED and make it be more suitable for manufacturing of large-size display panel.

Furthermore, the vacuum evaporation apparatus further includes a power mechanism disposed above the high temperature fluid output unit 30. In this embodiment, the power mechanism is a horizontal power mechanism 420. The horizontal power mechanism 420 is used to drive the evaporation sources 10 to move horizontally and reciprocally. The moving direction is vertical to an arrangement direction of the plurality of evaporation sources such that after the material vapor spray out from the vacuum intermediate layer 140, the material vapor can be uniformly distributed above the mask 230 inside the vacuum chamber. Of course, in another embodiment, the power mechanism can also be disposed below the cooling plate 210 to drive the cooling plate 210 and the substrate 220 and the mask 230 which are disposed above the cooling plate 210 to move in order to uniformly deposit the material vapor on the substrate. Or, the power mechanism may be a rotational power mechanism.

Third Embodiment

Figure 4:
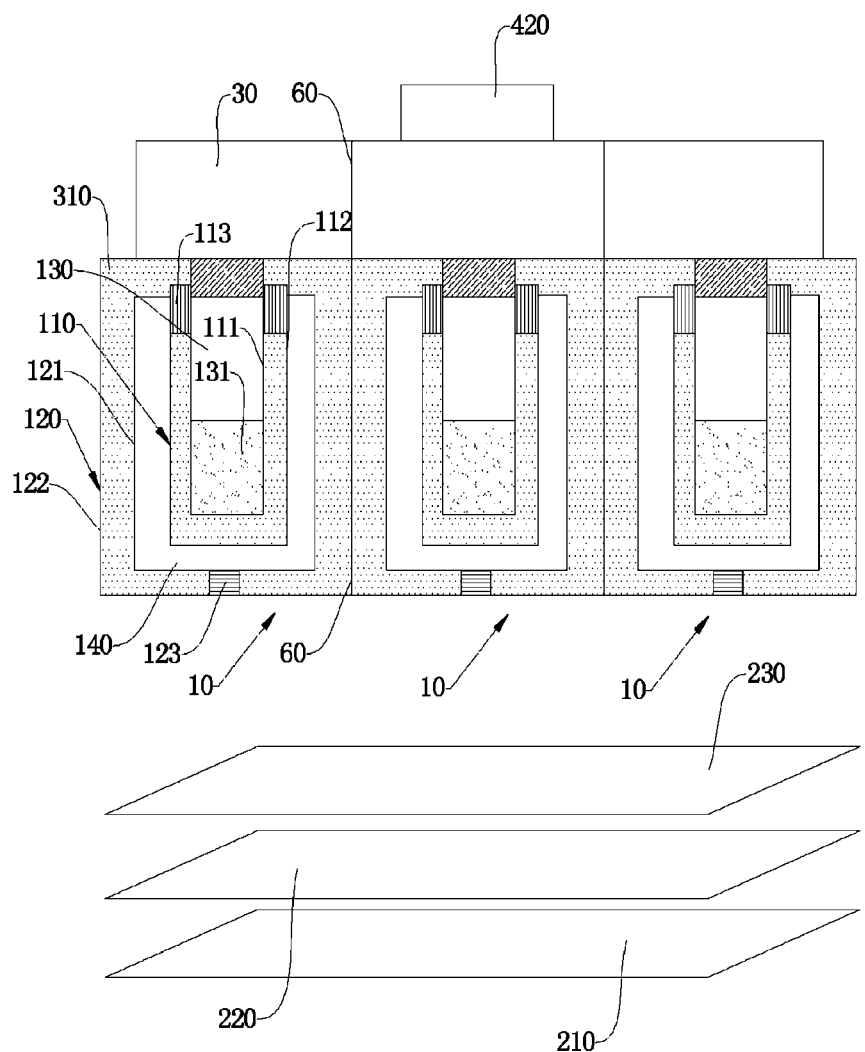
FIG. 4 is a schematic diagram of vacuum evaporation apparatus according to a third embodiment of the present invention.

With reference to FIG. 4, a vacuum evaporation apparatus according to the present embodiment comprises a vacuum chamber, an evaporation source 10 disposed within the interior of the vacuum chamber, and a cooling plate 210 disposed below the evaporation source 10, and a high temperature fluid output unit 30 which is located above the evaporation source 10, used for providing a high temperature fluid 310 for an inner heat unit 110 and an outer heat unit 120. Wherein, the cooling plate 210 is used for supporting, fixing and cooling a substrate 220 and a mask 230 sequentially disposed above the cooling plate 210. The evaporation source 10 comprises an inner heat unit 110 and an outer heat unit 120 located outside the inner heat unit 110. An inner wall 111 of the inner heat unit 110 forms a material container 130. An evaporation material 131 is installed inside the material container 130. A vacuum intermediate layer 140 is formed between an outer wall 112 of the inner heat unit 110 and an inner wall 121 of the outer heat unit 120. A side of the inner heat unit 110 provides with a first branch 113 which allowing the material vapor to pass through. A bottom side of the outer heat unit 120 provides with a second branch 123 which allowing the material vapor to pass through. The difference between this embodiment and the second embodiment is that vacuum evaporation apparatus comprises a plurality of evaporation sources 10 arranged in parallel, and a plurality of high temperature fluid output units 30 connected with the evaporation sources 10. Between two adjacent evaporation sources 10 and two adjacent high temperature fluid output units 30, it provided with a thermal insulation layer 60.

Furthermore, the vacuum evaporation apparatus further includes a power mechanism disposed above the high temperature fluid output unit 30. In this embodiment, the power mechanism is a horizontal power mechanism 420. The horizontal power mechanism 420 is used to drive the evaporation sources 10 to move horizontally and reciprocally. The moving direction is vertical to an arrangement direction of the plurality of evaporation sources such that after the material vapor spray out from the vacuum intermediate layer 140, the material vapor can be uniformly distributed above the mask 230 inside the vacuum chamber. Of course, in another embodiment, the power mechanism can also be disposed below the cooling plate 210 to drive the cooling plate 210, and the substrate 220 and the mask 230 which are disposed above the cooling plate 210 to move in order to uniformly deposit the material vapor on the substrate. Or, the power mechanism may be a rotational power mechanism.

In the vacuum evaporation apparatus provided by the present embodiment, the material container 130 of each evaporation source 10 may be placed with different evaporation materials. These evaporation materials may have different evaporation temperatures. In this way, it can ensure to increase evaporation rate of the evaporation materials 131 under the premise of uniformly heating for the evaporation materials 131 in order to increase the growth rate of the OLED. At the same time, it can be applied to a mixed evaporation mode for different doping materials.

In summary, the vacuum evaporation apparatus provided by the present invention uses the way of the vacuum intermediate layer disposed inside the evaporation source and the second branch disposed at the bottom side of the vacuum intermediate layer to spray out the material vapor which is evaporated from the evaporation material from the evaporation source and to deposit the material vapor on the substrate disposed below the evaporation source. Because the mask is disposed above the substrate, the bonding between the mask and the substrate is closer so as to eliminates the problem of mutual interference of the evaporation material of adjacent pixels because of the gap forming by the deformation at the middle of the mask by the gravity in order to increase the display effect of the display panel. At the same time, through the circular high temperature fluid, it performs heating for the material container and the vacuum intermediate layer in order to increase the heating uniformity of the evaporation material and the stability of the evaporation rate. At the same time, the vacuum evaporation apparatus provided by the present invention can not only increase the evaporation rate of the evaporation material, but also can be applied to a mixed evaporation mode for different doping materials.

It should be noted that, herein, the relational terms such as first and second, and the like are only used to distinguish one entity or operation from another entity or operation without necessarily requiring or implying that these entities or operations exist the actual relationship or order there between. Moreover, the terms "include", "comprise", or any other variation are intended to cover a non-exclusive inclusion, such that the process, method, article or device which include a series of elements are not only includes the process, method, article or device but also includes other elements which are not specifically listed or further include the inherent elements of such process, method, article or device. Without more constraints, by the statement "includes one . . . " does not exclude the existence of additional identical elements in the process, the element, the method, article, or the apparatus.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A vacuum evaporation apparatus, comprising
a vacuum chamber;
an evaporation source disposed in the interior of the vacuum chamber, wherein the evaporation source comprises an inner heat unit and an outer heat unit located outside the inner heat unit;
a material container formed at an inner wall of the inner heat unit;
a vacuum intermediate layer formed between an outer wall of the inner heat unit and the inner wall of the outer heat unit;
a first branch opening provided at the inner heat unit for allowing a vapor to pass through; and
a second branch opening provided at the outer heat unit for allowing the vapor to pass through;
wherein, the vacuum evaporation apparatus further comprises a high temperature fluid output unit for providing a high temperature fluid for the inner heat unit and the outer heat unit; the inner heat unit and the outer heat unit utilize the circular high temperature fluid to perform heating.

2. The vacuum evaporation apparatus according to claim 1, wherein, an opening of the second branch opening is smaller than a surface area of the first branch opening.

3. The vacuum evaporation apparatus according to claim 2, wherein, the vacuum evaporation apparatus further comprises a cooling plate disposed below the evaporation source, and the second branch opening is provided at a bottom side of the outer heat unit.

4. The vacuum evaporation apparatus according to claim 3, wherein, the vacuum evaporation apparatus comprises a power mechanism disposed above the evaporation source or below the cooling plate for driving the evaporation source or the cooling plate to move.

5. The vacuum evaporation apparatus according to claim 1, wherein, the vacuum evaporation apparatus comprises one evaporation source and one high temperature fluid output unit connected with the evaporation source.

6. The vacuum evaporation apparatus according to claim 1, wherein, the vacuum evaporation apparatus comprises a plurality of evaporation sources arranged in parallel and one high temperature fluid output unit connected with the plurality of evaporation sources.

7. The vacuum evaporation apparatus according to claim 1, wherein, the vacuum evaporation apparatus comprises a plurality of evaporation sources arranged in parallel, and a plurality of high temperature fluid output units respectively connected with the plurality of evaporation sources.

8. The vacuum evaporation apparatus according to claim 7, wherein, a thermal insulation layer is provided between two adjacent evaporation sources.

* * * * *